United States Patent [19]
Ootuka et al.

[11] Patent Number: 5,948,543
[45] Date of Patent: *Sep. 7, 1999

[54] LAMINATE BASE MATERIAL, A METHOD OF PRODUCING THE SAME, A PREPREG AND A LAMINATE

[75] Inventors: Minoru Ootuka; Hirokazu Hiraoka; Toru Shimadu; Masayuki Noda, all of Hikone, Japan

[73] Assignees: Shin-Kobe Electric Machinery Co., Ltd., Tokyo; Teijin Limited, Osaka; Oji Paper Co., Ltd., Tokyo, all of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/803,943

[22] Filed: Feb. 21, 1997

[30] Foreign Application Priority Data

Feb. 21, 1996 [JP] Japan ...................................... 8-033446
Sep. 4, 1996 [JP] Japan ...................................... 8-233814
Jan. 8, 1997 [JP] Japan ...................................... 9-001163

[51] Int. Cl.$^6$ ...................................................... B32B 27/08
[52] U.S. Cl. ........................ 428/474.4; 428/458; 442/415; 442/416
[58] Field of Search ...................................... 442/416, 415; 428/458, 474.4

[56] References Cited

FOREIGN PATENT DOCUMENTS 1361242  7/1974  United Kingdom ............. D04H 1/58
1486372  9/1977  United Kingdom ............. B32B 5/08

*Primary Examiner*—Helen L. Pezzuto
*Attorney, Agent, or Firm*—Pearne, Gordon, McCoy & Granger LLP

[57] ABSTRACT

A laminate base material of aromatic polyamide fiber non-woven fabric which comprises a combined non-woven fabric of para-aramid fibers and meta-aramid fibers bonded with each other by a resin binder such as an epoxy resin binder and meta-aramid fibres being thermally adhered to each other and meta-aramid fibers being thermally adhered to para-aramid fibers while they are passing through a pair of thermal rolls and heated and pressed by them and the meta-aramid fibers being included preferably by 5 through 30 weight %.

19 Claims, No Drawings

LAMINATE BASE MATERIAL, A METHOD OF PRODUCING THE SAME, A PREPREG AND A LAMINATE

BACKGROUND OF THE INVENTION

This invention pertains to a laminate base material of aromatic polyamide fiber non-woven fabric and to a method of producing the same. Also, this invention provides a laminate having a base material of aromatic polyamide fiber non-woven fabric constructed in accordance with the invention and suitably available for an insulating board for a printed wiring board on which leadless chip parts such as resistors, ICs and so on are surface-mounted.

Of late, in case that electronic parts such as resistors, ICs and so on are mounted on a printed wiring board which is assembled in an electronic device or instrument, the electronic parts have tended to be chipped and mounted on the printed wiring board by a surface-mount system. The surface-mount system is a preferable one because the electronic parts are compacted and lightened and have a high density.

In case that the leadless chip parts are surface-mounted on the printed wiring board, an insulation board of the printed wiring board should be so considered to have a coefficient of thermal expansion matched to that ($2-7\times10^{-6\circ}$ C.) of the leadless chip parts as much as possible. This is because if there is much difference between the coefficients of thermal expansion of the insulation board and the electronic parts, then there tends to occur a crack in soldered connections of the leadless chip parts due to a repetition of thermal shock cycle.

In view of this, a base material of non-woven fabric of aromatic polyamide fibers having a negative coeffcient of thermal expansion has been considered to be used for a laminate for a printed wiring board which may have a metal foil or foils clad thereto. Such a non-woven fabric may be formed by paper-making aromatic polyamide fibers such as p-phenylene-terephthalamide fibers or p-phenylene-diphenylether-terephthalamide fibers and binding the fibers to each other by a resin binder to form a paper. The laminate is formed by heating and pressing the non-woven fabric base material impregnated with thermosetting resin. Normally, a metal foil or foils may be heated and pressed onto the laminate so that they are integrated there and to form a metal clad laminate.

However, the prior laminate having the base material of conventional aromatic polyamide fiber non-woven fabric disadvantageously tends to get warpage or twist after formed or worked into the printed wiring board. Upon studying the causes due to which the warpage or twist of the laminate occurs, it has been found that the aromatic polyamide fibers of the base material are unevenly deformed due to fluidity of the thermosetting resin which is molten and moved by heat and pressure applied thereto on forming the laminate.

Since a melting temperature of the thermosetting resin with which the base material is impregnated and which is normally 80 to 140° C. is near or exceeds a glass transition temperature of the resin binder, the latter is so softened that the aromatic polyamide fibers are released from being bonded to each other.

When the leadless chip parts are soldered by the surface-mount system onto the printed wiring board which is formed by working the laminate having the base material of the conventional aromatic polyamide fibers to which may be clad a metal foil or foils, the temperature of 200° C. or more will be applied to the base material of the laminate. At that time, the base material will be partially expanded and shrank, but neither evenly expanded nor shrank so that it will show uneven movement. It has been found that this causes the printed wiring board to have warpage or twist provided thereto.

SUMMARY OF THE INVENTION

Accordingly, it is a principal object of the invention to provide a base material of aromatic polyamide fiber non-woven fabric for a laminate suitably used for an insulation base material of a printed wiring board adapted to effectively prevent the laminate from having warpage or twist provided thereto.

It is another object of the invention to provide a method of producing a base material of aromatic polyamide fiber non-woven fabric for a laminate suitably used for an insulation base material of a printed wiring board adapted to effectively prevent the laminate from having warpage or twist provided thereto.

It is further object of the invention to provide a combined non-woven fabric of aromatic polyamide fibers for a base material of a laminate suitably used for an insulation base material of a printed wiring board adapted to effectively prevent the laminate from having warpage or twist provided thereto.

It is further object of the invention to provide a laminate comprising a base material of aromatic polyamide fiber non-woven fabric and suitably used for an insulation base material of a printed wiring board adapted to effectively prevent the laminate from having warpage or twist provided thereto.

In accorance with a first aspect of the invention, there is provided a laminate base material comprising a combined non-woven fabric of para-aramid fibers and thermoplastic resin fibers having a softening temperature of 220° C. and more, said para-aramid fibers and said thermoplastic resin fibers being bonded by a resin binder while said thermoplastic resin fibers are adhered to each other in a molten manner and said thermoplastic resin fibers are adhered to said para-aramid fibers in a molten manner.

In accorance with a second aspect of the invention, there is provided a laminate base material comprising a combined non-woven fabric of para-aramid fibers and thermoplastic resin fibers having a softening temperature of 220° C. and more, said para-aramid fibers and said thermoplastic resin fibers being bonded to each other by a resin binder while said thermoplastic resin fibers are deformed by being thermally softened and intertwined with each other and said thermoplastic resin fibers are deformed by being thermally softened and said thermoplastic resin fibers and said para-aramid fibers are intertwined each other.

In the first and second aspects of the invention, the para-aramid fibers may be of either of p-phenylene-terephthalamide fibers and p-phenylene-diphenylether-terephthalamide fibers. The thermoplastic resin fibers having a softening temperature of 220° C. and more may be meta-aramid fibers such as m-phenylene-isophthatamide fibers. The m-phenylene-isophthalamide fibers may not be drawn and may have a fiber length of 3 to 10 mm.

The thermoplastic resin fibers having a softening temperature of 220° C. and more may have a content of 5 through 30 weight % and may be chopped fibers. They may have a fiber length of 3 through 10 mm.

The resin hinder may be of an epoxy resin binder and may have a content of 5 through 15 weight %.

In the specification, the concept of "a laminate base material" includes the following two concepts;

(1) one available for being impregnated with a thermosetting resin and heated and pressed to form a laminate.

(2) one available for being impregnated with a thermosetting resin to form an insulation layer which may be used for a multi-layer printed wiring board comprising inner layers and surface layers having printed wirings with the insulation layers disposed between the adjacent inner and/or surface layers.

In accordance with the third aspect of the invention, there is provided a method of producing a laminate base material comprising the steps of preparing a combined non-woven fabric formed by paper-making para-aramid fibers and thermoplastic resin fibers having a softening temperature of 220° C. and more and bonding said para-aramid fibers and said thermoplastic resin fibers by a resin binder and heating and pressing said combined non-woven fabric at more than a temperature at which said thermoplastic resin fibers are softened whereby said thermoplastic resin fibers are thermally adhered to each other and said thermoplastic resin fibers are thermally adhered to said para-aramid fibbers.

In accordance with the fourth aspect of the invention, there is provided a method of producing a laminate base material comprising the steps of preparing a combined non-woven fabric from by paper-making para-aramid fibers and thermoplastic resin fibers having a softening temperature of 220° C. and more and bonding said para-aramid fibers and said thermoplastic resin fibers by a resin binder and heating and pressing said combined non-woven fabric at over a temperature at which said thermoplastic resin fibers are so softened as to be deformed whereby said thermoplastic resin fibers are intertwined with each other and said thermoplastic resin fibers and said para-aramid fibers are intertwined with each other.

In the third and fourth aspects of the invention, the para-aramid fibers may be of either of p-phenylene-terephthalamide fibers and p-phenylene-diphenylether-terephthalamide fibers. The thermoplastic resin fibers having a softening temperature of 220° C. and more may be meta-aramid fibers such as m-phenylene-isophthalamide fibers.

The resin binder may be of an epoxy resin binder and may have a content of 5 through 15 weight %.

The non-woven fabric may be heated and pressed by a thermal roll or rolls and a temperature of the thermal rolls may be of 280 to 350° C. while a line pressure of the thermal rolls may be of 150 to 250 kgf/cm.

A prepreg may be formed by impregnating the laminate base material in the form of sheet with a thermosetting resin and drying it.

A laminate may be formed by heating and pressing the laminate base materials in the form of sheet, which are impregnated with a thermosetting resin. In case the laminate includes a plurality of sheets of base material, at least one sheet of base material may be prepared in accordance with the third or fourth aspect of the invention.

In the specification, the concept of "a laminate" includes the following three concepts;

(1) one available for heating and pressing one or a plurality of sheets of base material being impregnated with a thermosetting resin.

(2) one available in the same manner as the item (1) but having at least, one metal foil integrally provided on the laminate when the one or plurality of sheets of base material are heated and pressed.

(3) one available for an insulation layer formed of base material in the form of sheet, impregnated with a thermosetting resin and used for a multi-layer printed wiring board comprising inner layers and surface layers having printed wirings with the insulation layers disposed between the adjacent inner and/or surface layers.

With the thermoplastic resin fibers having a softening temperature of 220° C. and more bonded by the resin binder to each other and also with the thermoplastic resin fibers thermally adhered to each other or thermally deformed and intertwined each other and thermally adhered to the para-aramid fibers or together with the para-aramid fibers intertwined with each other, even though the resin binder is thermally softened when the laminate is formed whereby the fibers are loosed from being bonded by the resin binder to each other, the fibers are maintained at their adhesion to each other because they are thermally adhered to each other or intertwined with each other. As a result, when the thermosetting resin with which the base material is impregnated is molten and flows, the fibers which the base material is formed of are maintained at their bonding, which prevents the base material from being unevenly deformed. Also, when leadless chip parts are soldered onto the printed wiring board which is formed of the laminate or metal clad laminate, the board is prevented from being unevenly expanded or shrank.

DETAILED DESCRIPTION OF EMBODIMENTS OF THE INVENTION

Now, some embodiments of the invention will be described herein justbelow together with examples and comparisons.

A laminate base material of the invention comprises a non-woven fabric of combined para-aramid fibers and thermoplastic resin fibers having a softening temperature of 220° C. and more, both of which are bonded by a resin binder such as an epoxy resin hinder while the thermoplastic resin fibers are thermally adhered to each other and the thermoplastic resin fibers are thermally adhered to the para-aramid fibers. Alternatively, the thermoplastic resin fibers may be deformed by being thermally softened and intertwined with each other and the thermoplastic resin fibers are deformed by being thermally softened and intertwined together with the para-aramid fibers.

A content of the thermoplastic resin fibers may be preferably higher in view of more positively bonding the fibers to each other and preventing the laminate from getting warpage and twist, but preferably lower in view of making a heat resistance of the laminate higher. We find that the content of the thermoplastic resin fibers may be preferably 5 to 30 weight %.

A content of the resin binder may be preferably be 5 to 15 weight %. If the content of the resin binder does not reach 5 weight %, then the fibers are made more loosely bonded to each other. Thus, 5 to 15 weight %. If the content of the resin binder does not reach 5 weight %, then the fibers are made more loosely bonded to each other. Thus, 5 weight % of the content of the resin binder is the minimum value considered so as to positively provide a bonding strength to the combined non-woven fabric when it is introduced into a step of thermally adhering the combined non-woven fabric of the para-aramid fibers and the thermoplastic resin fibers to each other by thermal rolls. If the content of the resin binder exceeds 15 weight %, then the fibers tend to stick to the thermal rolls or the non-woven fabric tends to be broken when the fibers are thermally adhered to each other by the thermal rolls. Thus, 15 weight % of the content of the resin binder is the maximum value considered so as to prevent the fibers from sticking to the thermal rolls and the non-woven fabric from being broken.

The thermoplastic resin fibers having the softening temperature of 220° C. and more may be either of meta-aramid fibers such as m-phenylene-isophthalamide fibers, polyester fibers which may be typically polyethylene-terephathalate fibers or polybutylene-terephthalate fibers and nylon fibers which may he typically 6 nylon fibers or 66 nylon fibers, but never limited thereto, so long as they are thermoplastic resin fibers having the softening temperature of 220° C. and more. It should be noted that the softening temperature of the thermoplastic resin fibers is a thermal decomposition temperature or less of the para-aramid fibers. The thermoplastic resin fibers having the softening temperature of 220° C., and more may he preferably not drawn. The concept of tho thermoplastic resin fibers not drawn includes those, drawn at, small degree. With the thermoplastic resin fibers having the softening temperature, of 220° C. and more being not drawn, the fibers can be thermally adhered by the thermal rolls or intertwined with more ease.

The laminate of the invention is produced by using the base material of non-woven fabric formed by thermally adhering the thermoplastic resin fibers having the, softening temperature of 220 ° C. and more to each other or to the para-aramid fibers or thermally deforming and intertwining the former with each other or together with the para-aramid fibers in the manner as described hereinjustbelow.

At first, the non-woven fabric is impregnated with a thermosetting resin such as an epoxy resin which is normally used for an electrically insulating laminate to form a prepreg. One prepreg or a plurality of prepregs superposed one on another are heated and pressed. Normally, a metal foil or foils ;Are superposed on one surface or both surfaces of the prepreg before the prepreg is heated and pressed to form a metal clad laminate. In case that a plurality of prepregs are superposed one on another, one or some of the prepregs may be formed of the base material other than that of the invention. Such other base material may be of glass fiber woven fabric or glass non-woven fabric.

The combined non-woven fabric of para-aramid fibers and meta-aramid fibers may be in the form described as follows;

The para-aramid fibers may preferably have a fiber diameter of 1.5 denier and less and a fiber length of 6 mm and less. The meta-aramid fibers may preferably have a fiber diameter of 3 denier and less and a fiber length of 3 to 10 mm. The meta-aramid fibers may preferably be as long as possible in view of an increased number of points where they are thermally adhered or intertwined, but they may preferably be as short as possible in view of better dispersion of the fibers on paper-making. Thus, the fiber length of the meta-aramid fibers may be properly adjusted.

Also, the meta-aramid fibers may be in the form of fibril or in the form of no fibril or chop. With the chopped fibers used, the paper-made non-woven fabric has a higher void rate and as a result, the non-woven fabric can be more easily impregnated with the resin when the laminate is produced. Thus, it will be understood that the chopped meta-aramid fibers may be preferably used for producing the laminate in view of improvement on the moisture resistance and the insulation of the laminate.

Thermal adhesion may be preferably employed for adhering the meta-aramid fibers to each other or to the para-aramid fibers in a molten manner. More particularly, the paper-made non-woven fabric passes and is compressed between the thermal rolls while it is heated at, a temperature at which the meta-aramid fibers are softened, but not, stick to the thermal rolls. This causes the meta-aramid fibers to be thermally adhered to each other and to the para-aramid fibers. Even if the meta-aramid fibers cannot be thermally adhered, the meta-aramid fibers are deformed by the aforementioned operation of the meta-aramid fibers passing and being compressed between the thermal rolls and intertwined each other or together with the para-aramid fibers.

The thermal rolls may be suitably set at a temperature of 280 to 350° C. and at a line pressure of 150 to 250 Kgf/cm. The minimum temperature of 280° C. of the thermal rolls, is set in consideration of softening and adhering the meta-aramid fibers in a molten manner while the maximum temperature of 350° C., of the thermal rolls is set, in consideration of preventing the operation from being lowered due to the meta-aramid fibers sticking to the thermal rolls. If the softened and molten meta-aramid fibers stick to the thermal rolls, then the non-woven fabric tends to be broken during adhering the fibers to each other in a molten manner or to provide an unevenness to the surfaces of the non-woven fabric due to the fibers sticking the thermal rolls, which causes the non-woven fabric too have an uneven thickness. Therefore, the operation has to be more carefully made.

Furthermore, the non-woven fabric is compressed between the thermal rolls in a tangent manner. The line pressure is one per 1 cm of roll width. The non-woven fabric is required to obtain a predetermined heat quantity when it passes between the thermal rolls. Thus, the velocity of the non-woven fabric passing may preferably be set at 10 m/minute, and less, but not, limited thereto.

EXAMPLES 1 THROUGH 35, COMPARISONS 1 THROUGH 3 AND PRIOR ART)

Examples 1 through 11 had the conditions shown in Table I, Examples 12 through 22 had the conditions shown in Table II, Examples 23 through 33 had the conditions shown in Table III and Examples 34 and 35, Comparisons 1 through 3 and Prior Art had the conditions shown in Table IV, respectively.

In the Examples 1 through 35, the Comparisons 1 through 3 and the Prior Art, there were prepared para-aramid fibers commercially available as the tradename of TECHNOLA from TEIJIN CO., LTD., Japan and having a fiber diameter of 1.5 denier and a fiber length of 3 mm and chop-like and not-drawn meta-aramid fibers commercially available as the tradename of CONEX from TEIJIN CO., LTD., Japan and having a fiber diameter of 3 denier, a fiber length of 6 mm and a softening temperature of 280° C. TECHNOLA of TEIJIN CO. LTD. was of p-phenylene-diphenylether-terephthalamide fibers. The para-aramid fibers and the meta-aramid fibers were combined by paper-making and after a water soluble epoxy resin having a glass transition temperature of 110° C. as a resin binder was sprayed upon the combined fibers, they were heated and dried to form the aromatic polyamide fiber non-woven fabric having a unit weight of 60 g/m$^2$.

In the Examples 1 through 35, the Comparisons 1 through 3 and the Prior Art, the contents of the para-aramid fibers, the meta-aramid fibers and the resin binder of which the aromatic polyamide fiber non-woven fabric was formed are shown in the Tables I, II, III and IV. The aromatic polyamide fiber non-woven fabric passed between a pair of thermal rolls and were heated and compressed therebetween under the conditions of line pressure and roll temperature shown in the Tables I through IV to thermally adhere or deform the meta-aramid fibers. The velocity of the aromatic polyamide fiber non-woven fabric passing through the thermall rolls was set at 10 m/minute.

As noted from the Table IV, in the Comparisons 1 and 2, although the combined non-woven fabric was treated by the thermal rolls, the line pressure of the thermal rolls was beyond the preferable scope of 150 through 250 kgf/cm, which is substantially required in case that the combined non-woevn fabric is heated and compressed by the thermal rolls, but not by means other than the thermal rolls. Therefore, the thus produced aromatic polyamide fibers non-woven fabrics were as the Comparisons, but not as the Examples.

In the Comparison 3, the meta-aramid fibers were not, treated by the thermal rolls. In the Prior Art, only the para-aramid fibers were paper-made and the water soluble epoxy resin having thee glass transition temperature of 110° C., as the resin binder was sprayed upon the paper-made para-aramid fibers and thermally dried to form the aromatic polyamide fiber non-woven fabric having a unit weight of 60 g/m². It was not treated by the thermal rolls as well.

The thus produced laminate base material was impregnated with a varnish of brominated bisphenol A epoxy resin and thereafter dried to prepare a prepreg having a resin adhesion amount of 50 weight %. Five plies of the thus prepared prepreg were superposed one on another and copper foils of 18μm thickness were placed on both of the surfaces of the superposed prepregs. Theraftor, the prepregs and the copper folis were heated and pressed to form a copper clad laminate of 0.5 mm thickness.

(EXAMPLE 36)

The Example 36 has the conditions shown in the Table IV. In the Example 36, the non-woven fabric was prepared in the same manner as in the Example 1, except that the chop-like meta-aramid fibers were replaced by fibrillated meta-aramid fibers.

In the Tables, "EX." indicates "EXAMPLE", "COMP" indicates "COMPARISON", "PARA" indicates "para-aramid fibers", "META" indicates "meta-aramid fibers" and "BINDER" indicates "the resin binder".

TABLE I

| | CONTENT (Wt. %) | | | LINE PRESSURE | ROLL TEMP. |
|---|---|---|---|---|---|
| | PARA | META | BINDER | (Kgf/cm) | (° C.) |
| EX. 1 | 75 | 15 | 10 | 200 | 300 |
| EX. 2 | 85 | 5 | 10 | 200 | 300 |
| EX. 3 | 60 | 30 | 10 | 200 | 300 |
| EX. 4 | 79 | 16 | 5 | 200 | 300 |
| EX. 5 | 71 | 14 | 15 | 200 | 300 |
| EX. 6 | 75 | 15 | 10 | 150 | 300 |
| EX. 7 | 75 | 15 | 10 | 250 | 300 |
| EX. 8 | 75 | 15 | 10 | 200 | 280 |
| EX. 9 | 75 | 15 | 10 | 200 | 350 |
| EX. 10 | 85 | 5 | 10 | 150 | 300 |
| EX. 11 | 85 | 5 | 10 | 250 | 300 |

TABLE II

| | CONTENT (Wt. %) | | | LINE PRESSURE | ROLL TEMP. |
|---|---|---|---|---|---|
| | PARA | META | BINDER | (Kgf/cm) | (° C.) |
| EX. 12 | 85 | 5 | 10 | 200 | 280 |
| EX. 13 | 85 | 5 | 10 | 200 | 350 |
| EX. 14 | 60 | 30 | 10 | 150 | 300 |
| EX. 15 | 60 | 30 | 10 | 250 | 300 |
| EX. 16 | 60 | 30 | 10 | 200 | 280 |
| EX. 17 | 60 | 30 | 10 | 200 | 350 |
| EX. 18 | 79 | 16 | 5 | 150 | 300 |
| EX. 19 | 79 | 16 | 5 | 250 | 300 |
| EX. 20 | 79 | 16 | 5 | 200 | 280 |
| EX. 21 | 79 | 16 | 5 | 200 | 350 |
| EX. 22 | 71 | 14 | 15 | 150 | 300 |

TABLE III

| | CONTENT (Wt. %) | | | LINE PRESSURE | ROLL TEMP. |
|---|---|---|---|---|---|
| | PARA | META | BINDER | (Kgf/cm) | (° C.) |
| EX. 23 | 71 | 14 | 15 | 250 | 300 |
| EX. 24 | 71 | 14 | 15 | 200 | 280 |
| EX. 25 | 71 | 14 | 15 | 200 | 350 |
| EX. 26 | 88 | 2 | 10 | 200 | 300 |
| EX. 27 | 55 | 35 | 10 | 200 | 300 |
| EX. 28 | 88 | 2 | 10 | 150 | 300 |
| EX. 29 | 88 | 2 | 10 | 250 | 300 |
| EX. 30 | 88 | 2 | 10 | 200 | 280 |
| EX. 31 | 88 | 2 | 10 | 200 | 350 |
| EX. 32 | 55 | 35 | 10 | 150 | 300 |
| EX. 33 | 55 | 35 | 10 | 250 | 300 |

TABLE IV

| | CONTENT (Wt. %) | | | LINE PRESSURE | ROLL TEMP. |
|---|---|---|---|---|---|
| | PARA | META | BINDER | (Kgf/cm) | (° C.) |
| EX. 34 | 55 | 35 | 10 | 200 | 280 |
| EX. 35 | 55 | 35 | 10 | 200 | 350 |
| EX. 36 | 75 | 15 | 10 | 200 | 300 |
| COMP. 1 | 75 | 15 | 10 | 140 | 300 |
| COMP. 2 | 75 | 15 | 10 | 260 | 300 |
| COMP. 3 | 75 | 15 | 10 | — | — |
| PRIOR ART | 85 | 0 | 15 | — | — |

(EXAMPLE 37)

There were prepared para-aramid fibers commercially available as the tradename of TECHNOLA from TEIJIN CO., LTD., Japan and having a fiber diameter of 1.5 denier and a fiber length of 3 mm and chop-like polyethylene-terephthalate fibers having a fiber diameter of 3 denier, a fiber length of 6 mm and a softening temperature of 260° C. The para-aramid fibers of 75 weight %, and the chop-like polyethlene-terephthalate fibers of 15 weight % were combined by paper-making and after a water soluble epoxy resin having a glass transition temperature of 110° C. as the resin binder was sprayed upon the combined fibers, they were heated and dried to form the aromatic polyamide fiber non-woven fabric having a unit weight of 60 g/m² and the binder content of 10 weight %.

The aromatic polyamide fiber non-woven fabric passed between a pair of thermal rolls having a line pressure of 200 kgf/cm and a roll temperature of 280° C. and was heated and compressed therebetween so that the chop-like polyethylene-terephthalate fibers were thermally adhered to each other or deformed. The velocity of the aromatic polyamide fiber non-woven fabric passing through the thermal rolls was set, at 10 m/minute.

A copper clad laminate of 0.5 mm thickness was produced by using the thus formed laminate base material in the same manner as described in the Example 1.

(EXAMPLE 38)

There were prepared para-aramid fibers commercially available as the tradename of TECHNOLA from TEIJIN CO., LTD., Japan and having a fiber diameter of 1.5 denier and a fiber length of 3 mm and chop-like nylon fibers having a fiber diameter of 3 denier, a fiber length of 6 mm and a softening temperature of 220° C. The para-aramid fibers of 75 weight, % and the chop-like nylon fibers of 15 weight % were combined by paper-making and after a water soluble epoxy resin having a glass transition temperature of 110° C. as the resin binder was sprayed upon the combined fibers, they were heated in and dried to form the aromatic polyamide fiber non-woven fabric having a unit weight of 60 g/m$^2$ and the binder- content of 10 weight %.

The aromatic polyamide fiber non-woven fabric passed between a pair of thermal rolls having a line pressure of 200 kgf/cm and a roll temperature of 240° C. and was heated and compressed therebetween so that the chop-like nylon fibers were thermally adhered to each other or deformed. The velocity of the aromatic polyamide fiber non-woven fabric passing through the thermal rolls was set at 10 m/minute.

A copper clad laminate of 0.5 mm thickness was produced by using the thus formed laminate base material in the same manner as described in the Example 1.

(EXAMPLE 39)

There were prepared para-aramid fibers commercially available as the tradename of TECHNOLA from TEIJIN CO., LTD., Japan and having a fiber diameter of 1.5 denier And a fiber length of 6 mm and chop-like meta-aramid fibers having a fiber diameter of 3 denier, a fiber length of 10 mm and a softening temperature of 280° C. The para-aramid fibers of 75 weight % and the chop-like meta-aramid fibers of 15 weight % were combined by paper-making and after a water soluble epoxy resin having a glass transition temperature of 110° C. as the resin binder was sprayed upon the combined fibers, they were heated and dried to form the aromatic polyamide fiber non-woven fabric having a unit weight of 60 g/m$^2$ and the binder content of 10 weight %.

The aromatic polyamide fiber non-woven fabric passed between a pair of thermal rolls having a line pressure of 200 kgf/cm and a roll temperature of 300° C. and was heated and compressed therebetween so that, the chop-like meta-aramid fibers were thermally adhered to each other or deformed. The velocity of the aromatic polyamide fiber non-woven fabric passing through the thermal rolls was set at 10 m/minute.

A copper clad laminate of 0.5 mm thickness was produced by using the thus formed laminate base material in the same manner as described in the Example 1.

(EXAMPLE 40)

There were prepared para-aramid fibers commercially available as the tradename of TECHNOLA from TEIJIN CO., LTD., Japan and having a fiber diameter of 1.5 denier and a fiber length of 7 mm and chop-like meta-aramid fibers having a fiber diameter of 3 denier, a fiber length of 11 mm and a softening temperature of 280° C,. The para-aramid fibers of 75 weight % and the chop-like meta-aramid fibers of 15 weight, % were combined by paper-making and after a water soluble epoxy resin having a glass transition temperature of 110° C. as the resin binder was sprayed upon the combined fibers, they were heated and dried to form the aromatic polyamide fiber non-woven fabric having a unit weight of 60 g/m$^2$ and the binder content of 10 weight %.

The aromatic polyamide fiber non-woven fabric passed between a pair of thermal rolls having a line pressure of 200 kgf/cm and a roll temperature of 300° C. and was heated and compressed therebetween so that the chop-like meta-aramid fibers were thermally adhered to each other or deformed. The velocity of the aromatic polyamide fiber non-woven fabric passing through the thermal rolls was set, at 10 m/minute.

A copper clad laminate of 0.5 mm thickness was produced by using the thus formed laminate base material in the same manner as described in the Example 1.

Warpage, moisture resistance and insulation characteristics and soldering heat, resistance of the copper clad laminates produced in accordance with the Examples 1 through 40, the Comparisons 1 through 3 and the Prior Art and wet strength of the aromatic polyamide fiber non-woven fabrics themselves were measured. The results of measurement are shown in Tables V through VIII. The methods and the conditions of measurement of the characteristics were as -follows;

The warpage was determined by placing the samples on a plane, measuring an amount of distance or space of the the eight corners of the samples from the plane. The eight corners of the samples include the upper and lower corners thereof. The warpage was measured by determining the maximum amount of distance of the samples. In the tests of measurement, the warpage of the samples after the copper clad laminates were formed ("after formation" indicated in the Tables) was measured with the samples sized at 500 mm×500 mm. In the Tables, a symbol "○" on "after format ion" indicates that the warpage was less than 3 mm (excluding 3 mm), a symbol "X" thereon indicates that the warpage was more than 3 mm (including 3 mm) and a symbol "Δ" thereon indicates that a rate of "X" was less than 10% (including 10%). Meanwhile, the warpage after the copper clad laminates were worked into the printed wiring boards and treated by reflowing at the maximum temperature of 230° C. for surface-mounting parts thereon ("after heating" indicated in the Tables) was measured with the samples sized at 50 mm×70 mm. In the Tables, a symbol "○" on "after heating" indicates that the warpage was less than 2 mm (excluding 2 mm), a symbol "X" thereon indicates that the warpage was more than 2 mm (including 2 mm) and a symbol "Δ" thereon indicates that a rate of "X" was less than 10% (including 10%).

The moisture resistance and insulation characteristics were determined by measuring the insulation resistance of the samples after they were placed in a pressure cooker for 6 hours.

The soldering heat resistance was determined by confirming whether the samples which had no treatment before the test floated on a soldering bath were maintained at the normal state or got abnormal. In the Tables, a symbol "○" indicates that the samples had no abnormal state while a symbol "X" indicates that, the samples budged to get abnormal.

Finally, the solvent wet strength was determined by making the center portion of the non-woven fabric samples having a width of 15 mm and a length of 100 mm wet with methyl ethyl ketone and pulling the samples in the longitudinal direction thereof until they were broken. The pulling strength when the samples were broken corresponds to the solvent wet strength. In the Tables V through VIII, an abbreviation "MRIC" indicates the moisture resistance and insulation characteristics of the samples, an abbreviation "SHR" indicates the soldering heat resistance and an abbreviation "SWS" indicates the solvent wet strength of the samples. Also, in the Tables, an abbreviation "Af-f" indicates "After formation", an abbreviation "Af-h" indicates "After heating" and an abbreviation "M" indicates "and more". Furthermore, in the Table VIII, an abbreviation "CP." indicates "Comparison" and an abbreviation "P.A." indicates "Prior Art".

TABLE V

| | WARPAGE | | | | SWS |
|---|---|---|---|---|---|
| | Af-f | Af-h | MRIC($\Omega$) | SHR | (kgf/15 mm) |
| EX. 1 | ◯ | ◯ | $1.0 \times 10^{13}$ M | ◯ | 1.2 |
| EX. 2 | ◯ | ◯ | $1.0 \times 10^{13}$ M | ◯ | 1.2 |
| EX. 3 | ◯ | ◯ | $1.0 \times 10^{13}$ M | ◯ | 1.2 |
| EX. 4 | ◯ | ◯ | $1.0 \times 10^{13}$ M | ◯ | 1.0 |
| EX. 5 | ◯ | ◯ | $1.0 \times 10^{13}$ M | ◯ | 1.2 |
| EX. 6 | ◯ | ◯ | $1.0 \times 10^{13}$ M | ◯ | 1.2 |
| EX. 7 | ◯ | ◯ | $1.0 \times 10^{13}$ M | ◯ | 1.2 |
| EX. 8 | ◯ | ◯ | $1.0 \times 10^{13}$ M | ◯ | 1.2 |
| EX. 9 | ◯ | ◯ | $1.0 \times 10^{13}$ M | ◯ | 1.2 |
| EX. 10 | ◯ | ◯ | $1.0 \times 10^{13}$ M | ◯ | 1.2 |
| EX. 11 | ◯ | ◯ | $1.0 \times 10^{13}$ M | ◯ | 1.2 |

TABLE VI

| | WARPAGE | | | | SWS |
|---|---|---|---|---|---|
| | Af-f | Af-h | MRIC($\Omega$) | SHR | (kgf/15 mm) |
| EX. 12 | ◯ | ◯ | $1.0 \times 10^{13}$ M | ◯ | 1.2 |
| EX. 13 | ◯ | ◯ | $1.0 \times 10^{13}$ M | ◯ | 1.2 |
| EX. 14 | ◯ | ◯ | $1.0 \times 10^{13}$ M | ◯ | 1.2 |
| EX. 15 | ◯ | ◯ | $1.0 \times 10^{13}$ M | ◯ | 1.2 |
| EX. 16 | ◯ | ◯ | $1.0 \times 10^{13}$ M | ◯ | 1.2 |
| EX. 17 | ◯ | ◯ | $1.0 \times 10^{13}$ M | ◯ | 1.2 |
| EX. 18 | ◯ | ◯ | $1.0 \times 10^{13}$ M | ◯ | 1.0 |
| EX. 19 | ◯ | ◯ | $1.0 \times 10^{13}$ M | ◯ | 1.0 |
| EX. 20 | ◯ | ◯ | $1.0 \times 10^{13}$ M | ◯ | 1.0 |
| EX. 21 | ◯ | ◯ | $1.0 \times 10^{13}$ M | ◯ | 1.0 |
| EX. 22 | ◯ | ◯ | $1.0 \times 10^{13}$ M | ◯ | 1.2 |

TABLE VII

| | WARPAGE | | | | SWS (kgf/ |
|---|---|---|---|---|---|
| | Af-f | Af-h | MRIC ($\Omega$) | SHR | 15 mm) |
| EX. 23 | ◯ | ◯ | $1.0 \times 10^{13}$ M | ◯ | 1.2 |
| EX. 24 | ◯ | ◯ | $1.0 \times 10^{13}$ M | ◯ | 1.2 |
| EX. 25 | ◯ | ◯ | $1.0 \times 10^{13}$ M | ◯ | 1.2 |
| EX. 26 | △ | △ | $1.0 \times 10^{13}$ M | ◯ | 1.2 |
| EX. 27 | ◯ | ◯ | $1.0 \times 10^{12}$ | X | 1.2 |
| EX. 28 | △ | △ | $1.0 \times 10^{13}$ M | ◯ | 1.2 |
| EX. 29 | △ | △ | $1.0 \times 10^{13}$ M | ◯ | 1.2 |
| EX. 30 | △ | △ | $1.0 \times 10^{13}$ M | ◯ | 1.2 |
| EX. 31 | △ | △ | $1.0 \times 10^{13}$ M | ◯ | 1.2 |
| EX. 32 | ◯ | ◯ | $1.5 \times 10^{12}$ | X | 1.2 |
| EX. 33 | ◯ | ◯ | $1.0 \times 10^{12}$ | X | 1.2 |

TABLE VIII

| | WARPAGE | | | | SWS |
|---|---|---|---|---|---|
| | Af-f | Af-h | MRIC($\Omega$) | SHR | (kgf/15 mm) |
| EX. 34 | ◯ | ◯ | $1.5 \times 10^{12}$ | X | 1.2 |
| EX. 35 | ◯ | ◯ | $1.5 \times 10^{12}$ | X | 1.2 |
| EX. 36 | ◯ | ◯ | $1.0 \times 10^{12}$ | ◯ | 1.2 |
| EX. 37 | ◯ | ◯ | $1.0 \times 10^{12}$ | ◯ | 1.2 |
| EX. 38 | ◯ | ◯ | $1.0 \times 10^{12}$ | ◯ | 1.2 |
| EX. 39 | ◯ | ◯ | $1.0 \times 10^{12}$ | ◯ | 1.6 |
| EX. 40 | ◯ | ◯ | $1.0 \times 10^{12}$ | X | 1.7 |
| CP. 1 | X | X | $1.0 \times 10^{13}$ M | ◯ | 1.0 |
| CP. 2 | | | Unable to be measured* | | |
| CP. 3 | X | X | $1.0 \times 10^{13}$ M | ◯ | 0.6 |
| P.A. | X | X | $1.0 \times 10^{13}$ M | ◯ | 1.0 |

In the Table VIII, the characteristics of the sample of the Comparison 2 were unable to be measured due to wrinkle of the non-woven fabric produced by being treated by the thermal rolls.

As noted from the Tables V through VIII, although the Comparisons 1 and 2 used the same components and the same contents as those of the Examples 1 and 6 though 9, the copper clad laminmates resultant from the products of the Comparisons 1 and 2 had the warpage characteristics worse than those of the aforemntioned Examples. This is caused by the Comparisons 1 and 2 making the line pressure of the thermal rolls lower or higher beyond the preferable scope of 150 through 250 kgf/cm, which is substantially required in case that the combined non-woevn fabrics heated and compressed by the thermal rolls. As noted from the Comparison 1, with the line pressure of the thermal rolls too low beyond 150 kgf/cm, the fibers were not enough to be adhered to each other or to be intertwined each other, which caused the warpage to be larger. Reversely, as noted from the Comparison 2, the line pressure of the thermal rolls too high beyond 250 kgf/cm, the combined non-woven fabric was excessively compressed, which caused the wrinkle to occur.

As noted from the Table VII and VIII, the laminates resultant from the Examples 27 and 32 through 35 had the poor soldering heat resiatnce, this is why the content of the used para-aramid fibers is smaller than that of the other Examples, as aforementioned. As noted from the Table VIII, the laminate resualtant from the Example 40 also had the poor soldering heat resistance. This is why the fiber length of the used para-aramid fibers was 7 mm, which was longer than that of the other Examples. With the fiber length of the used para-aramid fibers too tong, they disadvantagously got worse or uneven dispersion when the combined non-woven fabric was paper-made, which caused the soldering heat resistance to be lowered because the resultant non-woven fabric was poorly impregnated with the resin varnish due to the highly densed fibers thereof.

Although some embodiments of the invention have been described together with many Examples, some Comparisons and a Prior Art, it will be understood by those skilled in the art that they are by way of examples, and that various changes and modifications might be made without departing from the spirit and scope of the invention, which is intedend to be defined only to the appended claims.

What is claimed is:

1. A laminate base material consisting of a combined non-woven fabric of para-aramid fibers and thermoplastic resin fibers having a softening temperature of 220° C. and higher, said para-aramid fibers and said thermoplastic resin fibers being bonded by a resin binder in an open matrix for receipt of an impregnating resin with said thermoplastic resin fibers adhered to each other and to said para-aramid fibers in a molten manner, said thermoplastic resin fibers comprising from 5 to 30% by weight of the laminate base material.

2. A laminate base material consisting of a combined non-woven fabric of para-aramid fibers and thermoplastic resin fibers having a softening temperature of 220° C. and higher, said para-aramid fibers and said thermoplastic resin fibers being bonded by a resin binder in an open matrix for receipt of an impregnating resin with said thermoplastic resin fibers thermally softened and deformed and intertwined with each other and together with said para-aramid fibers, said thermoplastic resin fibers comprising from 5 to 30% by weight of the laminate base material.

3. A laminate base material as set forth in either of claims 1 and 2, and wherein said resin binder comprises from 5 to 15% by weight of the laminate base material.

4. A laminate base material as set forth in either of claims 1 and 2, and wherein said thermoplatic resin fibers having a softening temperature of 220° C. and more are in the form of chopped fiber.

5. A laminate base material as set forth in either of claims 1 and 2, and wherein said para-aramid fibers are of p-phenylene-terephthalamide fibers.

6. A laminate base material as set forth in claim 5, and wherein said p-phenylene-terephthalamide fibers have a fiber length of 6 mm and less while said thermoplastic resin fibers having a softening temperature of 220 ° C. and more have a fiber length of 3 through 10 mm.

7. A laminate base material as set forth in either of claims 1 and 2, and wherein said para-aramid fibers are of p-phenylene-di-phenylether-terephthalamide fibers.

8. A laminate base material as set forth in either of claims 1 and 2, and wherein said thermoplastic resin fibers having a softening temperature of 220° C. and more are of m-phenylene-isophthalaimde fibers.

9. A laminate base material as set forth in claim 8, and wherein said m-phenylene-isophthalamide fibers are those which are not drawn.

10. A method of producing a laminate base material consisting of a combined non-woven fabric formed of para-aramid fibers, thermoplastic resin fibers having a softening temperature of 220° C. and higher and a resin binder comprising the steps of preparing said combined non-woven fabric formed by paper-making said para-aramid fibers and said thermoplastic resin fibers and bonding said para-aramid fibers and said thermoplastic resin fibers in an open matrix for receipt of an impregnating resin with said resin binder; and heating and pressing said combined non-woven fabric at a temperature higher than that at which said thermoplastic resin fibers are softened whereby said thermoplastic resin fibers are thermally adhered to each other and to said para-aramid fibers, said thermoplastic resin fibers comprising from 5 to 30% by weight of the laminate base material.

11. A method of producing a laminate base material consisting of a combined non-woven fabric formed of para-aramid fibers, thermoplastic resin fibers having a softening temperature of 220° C. and higher and a resin binder comprising the steps of preparing said combined non-woven fabric formed by paper-making said para-aramid fibers and said thermoplastic resin fibers and bonding said para-aramid fibers and said thermoplastic resin fibers in an open matrix for receipt of an impregnating resin with said resin binder; and heating and pressing said combined non-woven fabric at a temperature higher than that at which said thermoplastic resin fibers are softened and deformed whereby said deformed thermoplastic resin fibers are intertwined with each other and with said para-aramid fibers, said thermoplastic resin fibers comprising from 5 to 30% by weight of the laminate base material.

12. A method of producing a laminate base material as set forth in either of claims 10 and 11, and wherein said para-aramid fibers are of p-phenylene-terephthalamide fibers.

13. A method of producing a laminate base material as set forth in either of claims 10 and 11, and wherein said para-aramid fibers are of p-phenylene-diphenylether-terephthalamide fibers.

14. A method of producing a laminate base material as set forth in either of claims 10 and 11, and wherein said step of heating and pressing said combined non-woven fabric is made by thermal rolls while a temperature of said thermal rolls is set at 280 through 350° C. and a line pressure of said thermal rolls is set at 150 through 250 kgf/cm.

15. A combined non-woven fabric adapted to be used for producing a laminate base material by heating and pressing said combined non-woven fabric, said combined non-woven fabric consisting of para-aramid fibers and thermoplastic resin fibers having a softening temperature of 220° C. and higher, said para-aramid fibers and said thermoplastic resin fibers being combined and paper-made and being bonded to each other by a resin binder in an open matrix for receipt of an impregnating resin whereby when said combined non-woven fabric is heated and pressed at a temperature higher than that at which said thermoplastic resin fibers are softened for producing said laminate base material, said thermoplastic resin fibers are thermally adhered to each other and to said para-aramid fibers, said thermoplastic resin fibers comprising from 5 to 30% by weight of the laminate base material.

16. A combined non-woven fabric adapted to be used for producing a laminate base material by heating and pressing said combined non-woven fabric, said combined non-woven fabric consisting of para-aramid fibers and thermoplastic resin fibers having a softening temperature of 220° C. and higher, and para-aramid fibers and said thermoplastic resin fibers being combined and paper-made and being bonded to each other by a resin binder in an open matrix for receipt of an impregnating resin whereby when said combined non-woven fabric is heated and pressed for producing said laminate base material at a temperature higher than that at which said thermoplastic resin fibers are softened, said thermoplastic resin fibers are thermally deformed and intertwined with each other and together with said para-aramid fibers, said thermoplastic resin fibers comprising from 5 to 30% by weight of the laminate base material.

17. A combined non-woven fabric as set forth in either of claims 15 and 16, and wherein said resin binder comprises from 5 to 15% by weight of the laminate base material.

18. A combined non-woven fabric as set forth in either of claims 15 and 16, and wherein said para-aramid fibers are of p-phenylene-terephthalamide fibers.

19. A combined non-woven fabric as set forth in either of claims 15 and 16, and wherein said para-aramid fibers are of p-phenylene-diphenylether-terephthalamide fibers.

* * * * *